US006873842B2

(12) United States Patent
Elayda et al.

(10) Patent No.: US 6,873,842 B2
(45) Date of Patent: Mar. 29, 2005

(54) WIRELESS PROGRAMMABLE LOGIC DEVICES

(75) Inventors: Bernardo Elayda, San Jose, CA (US); Brian D. Erickson, Soquel, CA (US)

(73) Assignee: Xilinx, Inc., San Jose, CA (US)

(*) Notice: Subject to any disclaimer, the term of this patent is extended or adjusted under 35 U.S.C. 154(b) by 636 days.

(21) Appl. No.: 09/823,591

(22) Filed: Mar. 30, 2001

(65) Prior Publication Data

US 2002/0173298 A1 Nov. 21, 2002

(51) Int. Cl.[7] .................................................. H04B 7/00
(52) U.S. Cl. ...................... 455/418; 455/419; 455/420
(58) Field of Search ............................ 455/66.1, 412.1, 455/414.1, 418, 419, 420, 422.1, 424, 425

(56) References Cited

U.S. PATENT DOCUMENTS

| | | | | | |
|---|---|---|---|---|---|
| 4,199,761 | A | * | 4/1980 | Whyte et al. ........... | 340/825.52 |
| 5,898,905 | A | * | 4/1999 | Aldridge et al. ......... | 455/67.14 |
| 5,974,312 | A | * | 10/1999 | Hayes et al. ............. | 455/419 |
| 6,023,570 | A | * | 2/2000 | Tang et al. .............. | 716/17 |
| 6,088,457 | A | * | 7/2000 | Parkinson et al. ......... | 380/270 |
| 6,091,956 | A | * | 7/2000 | Hollenberg .............. | 455/456.5 |
| 6,339,612 | B1 | * | 1/2002 | Stewart et al. ............ | 375/140 |
| 6,389,321 | B2 | * | 5/2002 | Tang et al. .............. | 700/2 |
| 6,549,770 | B1 | * | 4/2003 | Marran ................... | 455/419 |
| 6,560,448 | B1 | * | 5/2003 | Baldwin et al. .......... | 455/234.1 |
| 6,633,769 | B2 | * | 10/2003 | Shoobridge .............. | 455/574 |
| 2001/0016500 | A1 | * | 8/2001 | Son et al. ................ | 455/456 |

FOREIGN PATENT DOCUMENTS

WO    WO 99/23588    5/1999

OTHER PUBLICATIONS

David Nicklin; "Reconfigurable Basestations & Software Radios Utilising FPGAs"; electronic engineering; Jun. 1999; pp. 65–67.

* cited by examiner

Primary Examiner—CongVan Tran
(74) Attorney, Agent, or Firm—H. C. Chan

(57) ABSTRACT

A wireless programmable logic device contains a wireless component and a programmable logic component. A remote wireless host can be used to program the programmable logic device. Some product designs require multiple programmable logic devices. When wireless programmable logic devices are used in the design, all of them can receive data and commands from the host. As a result, the wireless host can control the order of configuration and the start time of these logic devices. There is no need to build glue logic for this purpose. Consequently, the efficiency in product design is improved. If there are problems in programming a programmable logic device, the host can log the failed operation in its memory. This information could be used to improve production flow.

18 Claims, 7 Drawing Sheets

WIRELESS PROGRAMMABLE LOGIC DEVICES

FIELD OF THE INVENTION

This invention relates to programmable logic devices, and more specification to programmable logic devices that can interface with a remote host using wireless communication.

BACKGROUND OF THE INVENTION

Programmable logic devices exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic devices, called the field programmable gate array (FPGA), is very popular because of a superior combination of capacity, flexibility and cost. A FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBS, IOBs, and interconnect structure are configured. The configuration bitstream may be read from an external memory (e.g., an external PROM). The collective states of the individual memory cells then determine the function of the FPGA.

Due to advances in semiconductor processing technology, more and more transistors can be fabricated onto the same area in an IC. This leads to more functionality. As a result, pin counts of the devices need to be increased to support the functionality. Recently, some of the FPGAs have around one thousand pins.

Because these FPGAs can be programmed to perform many functions, they are used in more and more product designs. In some complex product designs, more than one FPGA is used in a product. Some of these FPGAs need to start operation at different times after configuration. In the past, engineers have to design glue logic to handle the configuration and start time of these FPGAs. In many cases, this glue logic takes up valuable real estate on a circuit board. In addition, the glue logic is typically custom designed for each product. Consequently, it is a time consuming and inefficient process.

The large number of pins on a FPGA also means that the circuit board is more congested because many of the pins are connected to other ICs. Thus, it is increasing difficult to find space on a circuit board to place the above-mentioned glue logic.

Therefore, it is desirable to reduce unnecessary circuits on a circuit board. It is also desirable to improve efficiency in using FPGAs.

SUMMARY OF THE INVENTION

The programmable logic device of the present invention is a single IC that contains a wireless component connected to a conventional programmable logic component. The wireless component can receive and process wireless data from a remote wireless host. The data is delivered to the programmable logic component for programming the same. One advantage of this invention is that the programming data is stored remotely and all the programming circuitry is located on the IC. Thus, minimum real estate on a circuit board is used for programming purpose.

Some product designs require multiple programmable logic devices. When wireless programmable logic devices are used, all of them can receive data and commands from a remote wireless host. As a result, the wireless host can control the order of configuration and the start time of these logic devices. There is no need to build glue logic for this purpose. Consequently, the efficiency in product design is improved.

If there are problems in programming a programmable logic device, the host can log the failed operation in its memory. The logged information may include the identification of the programmable logic device, the time of communication, etc. This information could be used to improve production flow.

The above summary of the present invention is not intended to describe each disclosed embodiment of the present invention. The figures and detailed description that follow provide additional example embodiments and aspects of the present invention.

BRIEF DESCRIPTION OF THE DRAWINGS

The present invention is illustrated by way of example, and not by way of limitation, in the detailed description and the following figures, in which like reference numerals refer to similar elements.

DETAILED DESCRIPTION OF THE INVENTION

The present invention relates to wireless communication with programmable logic devices. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Figure 1:
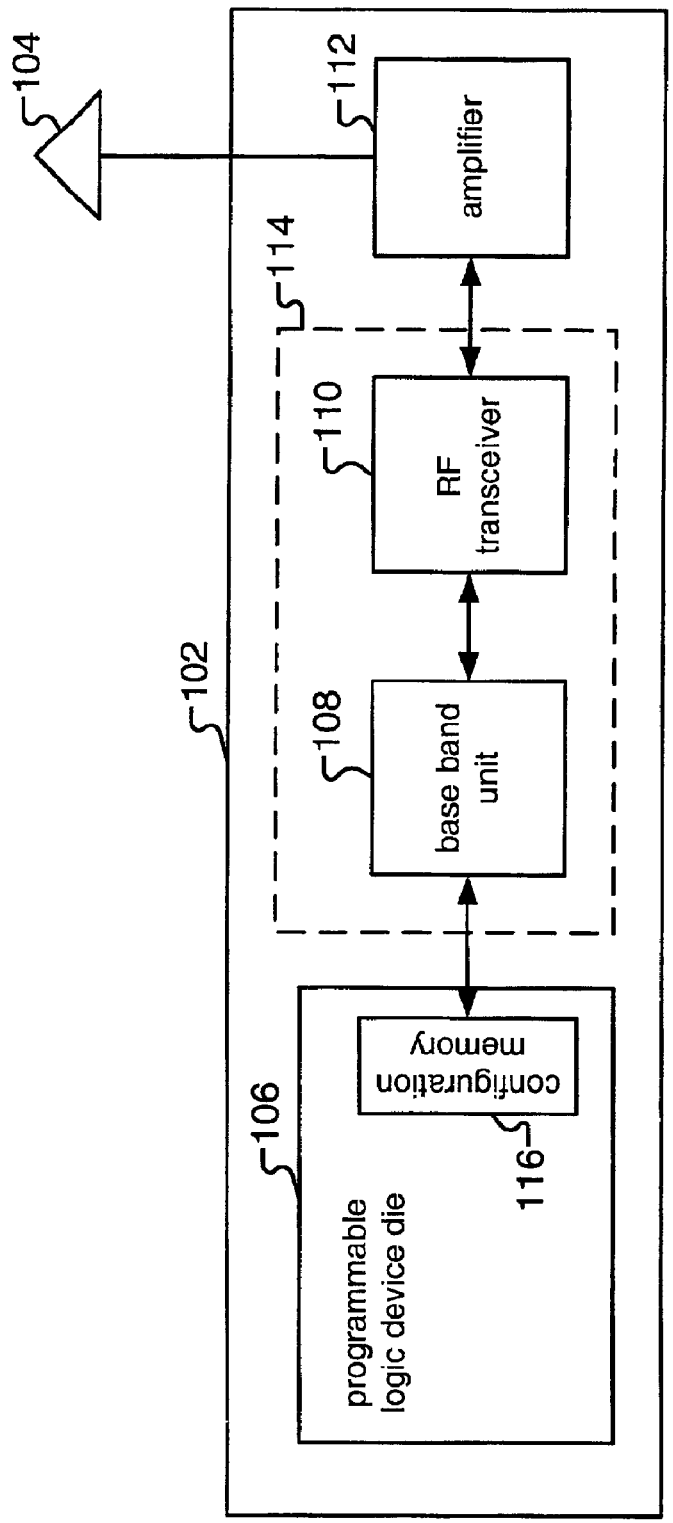
FIG. 1 is a block diagram showing a wireless programmable logic device of the present invention.

FIG. 1 is a block diagram showing a wireless programmable logic device 102 of the present invention connected to an antenna 104. Wireless programmable logic device 102 contains a programmable logic device die 106, a base band unit 108, a radio frequency (RF) transceiver 110, and an optional power amplifier 112. Programmable logic device die 106 could be a FPGA, PLA, CPLD, or PPROM die. Base band unit 108 and transceiver 110 may be fabricated into one RF die 114. In one embodiment, dies 106 and 114 and power amplifier 112 are combined in a multi-chip module (MCM). In another embodiment, CMOS process is used. Currently, both the programmable logic device die and base band unit 108 can be implemented using CMOS process. Recently, there are tremendous advances in implementing RF circuit using CMOS process. For example, a new IC built on 0.18 µm CMOS process, called the TC2000 and is marketed by Zeevo Inc., contains the radio, base band unit and interfaces. In this embodiment of wireless programmable logic devices, CMOS process is used to integrate as many functional blocks as possible into a single IC.

It should be noted that the word "wireless" is not limited to RF. It includes optical, audio and other means of communication without the use of wired connection.

Base band unit 108 performs data processing of wireless data sent and received by wireless programmable logic device 102. Examples of some of the operations performed by base band unit 108 are: error correction, data communication link control, digital offset cancellation and symbol synchronization, encryption, data buffering, etc. RF transceiver 110 preferably contains a voltage-controlled oscillator, a low noise amplifier, a modulator, a demodulator, filters, etc.

Antenna 104 may be fabricated on the MCM package itself. Alternatively, it may be externally provided (e.g., in the form of a metal strip on a circuit board)

The present invention can be used with different wireless communication protocols. An exemplary protocol is Bluetooth. This protocol uses spread spectrum frequency hopping signals in the unlicensed 2.4 GHz ISM (Industrial, Science and Medical) band. The current specification defines a range of around 100 meters supporting data rate of up to 720 kb/s per channel. Other wireless communication protocols may provide for longer ranges and/or higher data rate.

If wireless programmable logic device 102 is a FPGA, it needs to be configured by a configuration bitstream after power is turned on. In a conventional system, an external nonvolatile memory (not shown), such as a PROM (programmable read-only memory), is used to store the bitstream. The stored bitstream is transmitted to a configuration memory in the FPGA via dedicated pins on the FPGA. In one embodiment, this bitstream can be transmitted to a configuration memory 116 of device 102 using wireless means. As a result, there is no need to have dedicated pins for configuration. Further, there is no need to place an external nonvolatile memory on the circuit board. As a result, real estate on the circuit board can be better utilized.

Figure 2:
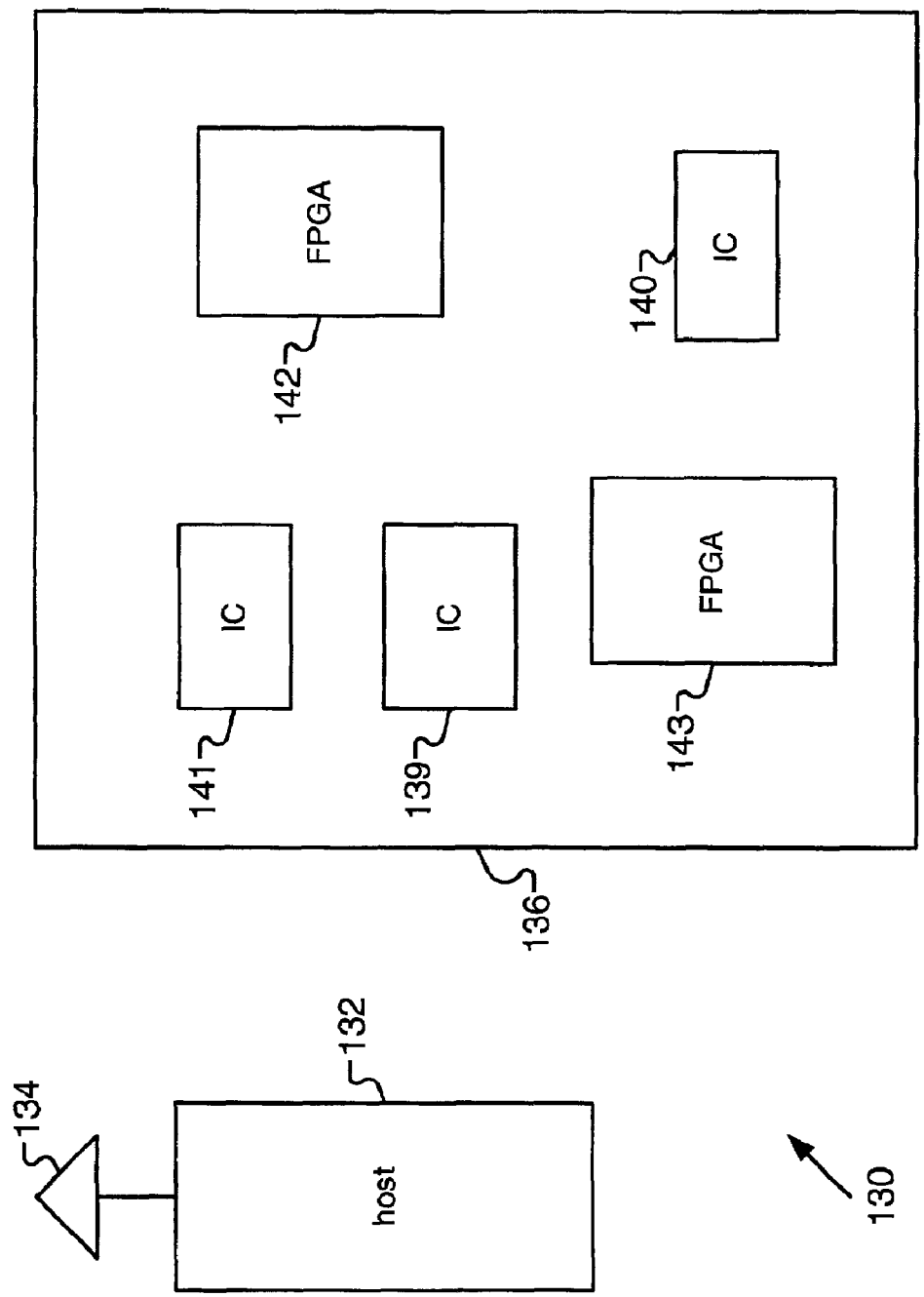
FIG. 2 is a block diagram of a wireless configuration system of the present invention.

FIG. 2 shows a wireless based configuration system 130 of the present invention. It contains a configuration host 132 and a circuit board 136 having a plurality of ICs, such as ICs 139–143. Some of the ICs may be programmable logic devices, such as FPGAs 142 and 143. Host 132 contains memory (not shown) that stores the configuration bitstreams of FPGAs 142 and 143. The bitstreams are delivered to FPGAs 142 and 143 via an antenna 134.

Figure 3:
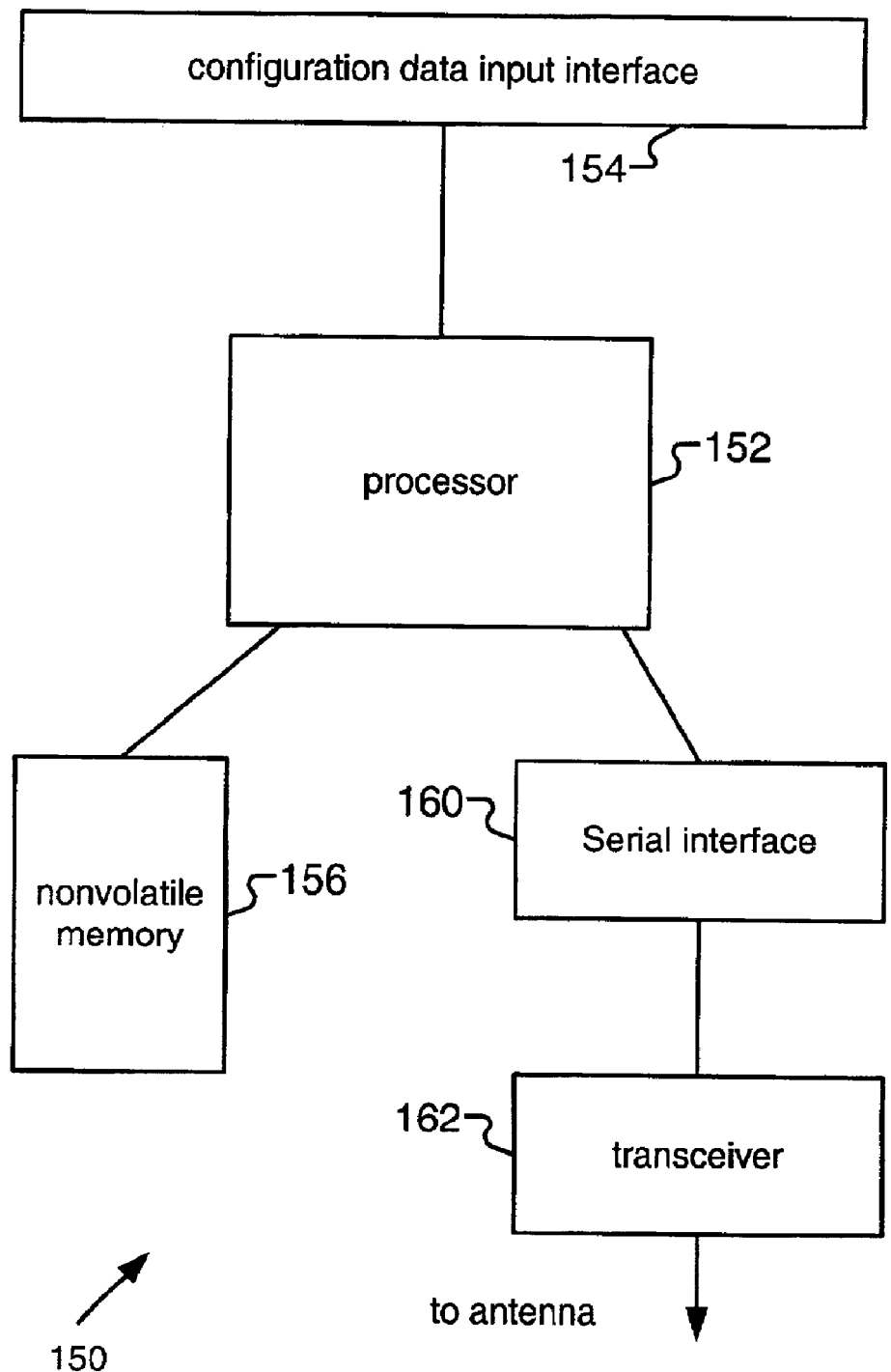
FIG. 3 is a block diagram of a configuration host of the present invention.

FIG. 3 is a block diagram of one embodiment of a configuration host 150 of the present invention. It comprises a processor 152 that controls its operation. Host 150 contains a configuration data input interface 154 that receives configuration bitstream from an external source (not shown). Processor 152 stores the bitstream in a memory 156. Whenever there is a need to configure a FPGA, processor 152 retrieves the bitstream from memory 156 and delivers the data to a serial interface 160. The serialized data is deliver to antenna 134 by a transceiver 162. An optional amplifier may be inserted between transceiver 162 and antenna 134. Memory 156 is preferably, but not necessarily, nonvolatile.

In another embodiment, host 150 can be designed as a self-contained state machine.

Figure 4:
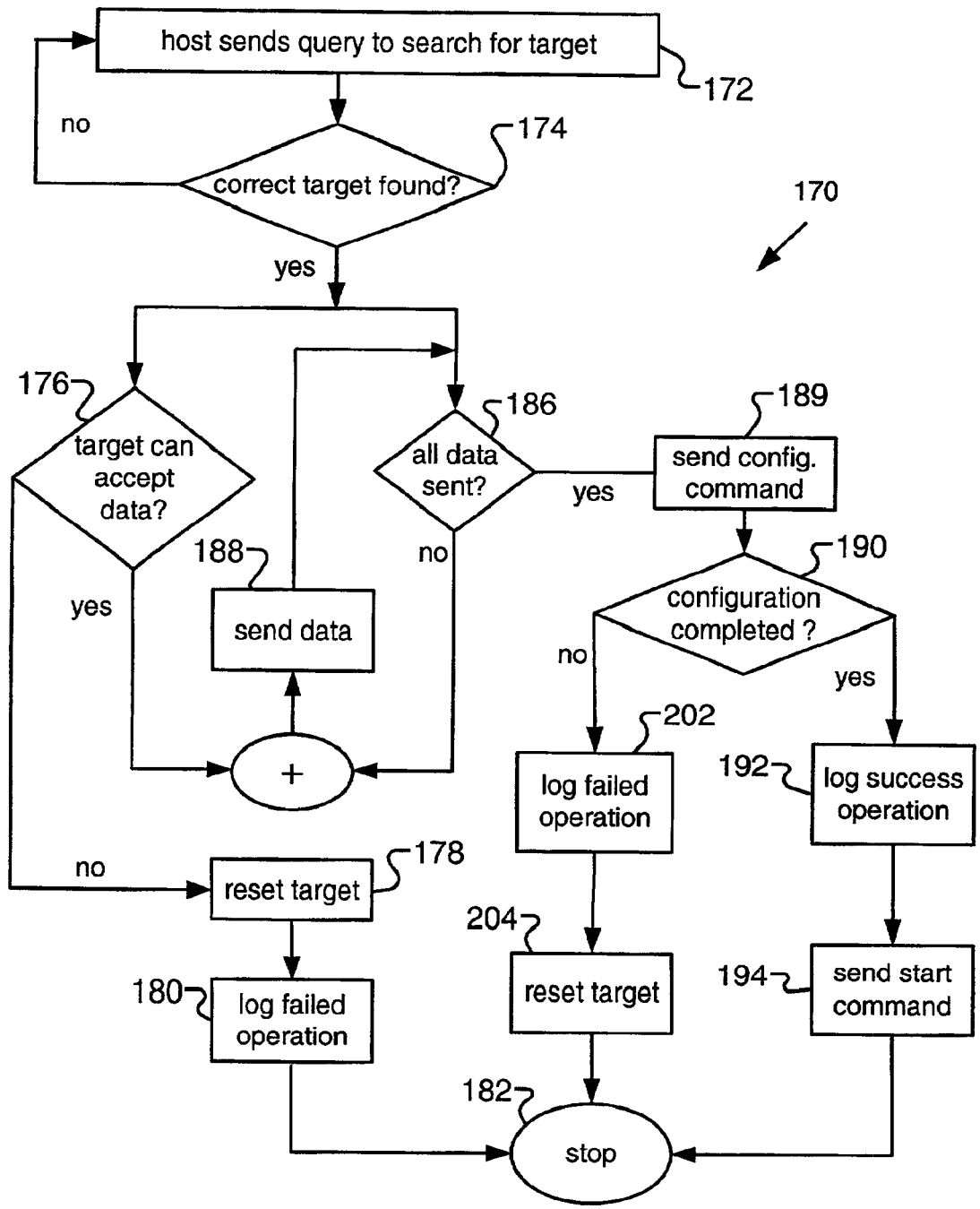
FIG. 4 is a flow chart of a configuration process of the present invention.

The interaction between host 132 and a single FPGA is now described. FIG. 4 shows a flow chart 170 of the interaction. In step 172, host 132 sends a query to search for a recognizable FPGA. This query is preferably a digital pattern encoded on an electromagnetic wave of a predetermined frequency and duration. An FPGA responds to the query by sending its identification to host 132. In step 174, host 132 determines whether the responding FPGA is a target FPGA. If no target is found, host 132 continues to search for a recognizable FPGA. If a target is found, host 132 performs two types of operations at the same time: (1) sending out configuration bitstream data and (2) determining whether the target FPGA is working properly. In step 176, host 132 determines whether the FPGA can continue to accept configuration data. In one embodiment, the FPGA sends a predetermined signal to host 132 if it cannot accept configuration data. If no such signal is received, host 132 assumes that it can continue to send configuration signal. If such a signal is received, host 132 sends a command to reset the target FPGA (step 178). In step 180, host 132 logs this failed operation. The information may be stored in nonvolatile memory 156 for later retrieval by a user who needs to know the status of the configuration. Additional information related to the failure (e.g., the time of failure) may also be logged. Flow chart 170 then stops (step 182).

As mentioned above, host 132 sends out configuration data unless requested not to do so. In step 186, host 154 determines whether all configuration data stored in nonvolatile memory 156 has been sent. If not all the data has been sent, host 132 continues to send the data (step 188). If all the data has been sent, host 132 sends a command to configure the target FPGA (step 189). Host 132 waits for the FPGA to complete the configuration (step 190). If configuration is successful, host 132 logs a successful configuration operation in its nonvolatile memory 156 (step 192). Host 132 then sends a start command to the target FPGA to start normal operation (step 194). Flow chart 170 then ends (step 182). If configuration fails, host 132 logs a failed operation (step 202). It then sends a command to reset the target FPGA (step 204). The flow chart then terminates (step 182).

It can be seen from the above that the FPGA does not need to have wired contact with a nonvolatile memory on the same circuit board. Further, it is possible to log more information using the system of the present invention. The information could be used to improve product manufacturing.

Figure 5A:
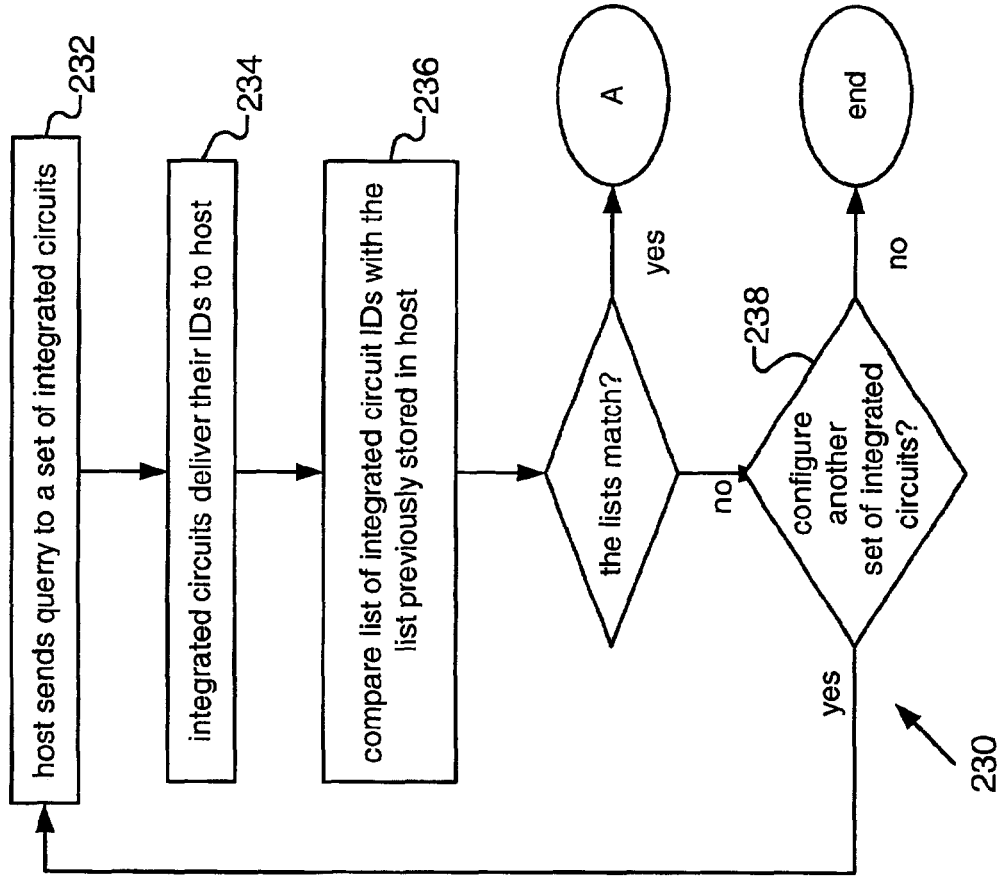
FIGS. 5A and 5B shows the steps of configuring multiple wireless FPGAs of the present invention.
Figure 5B:
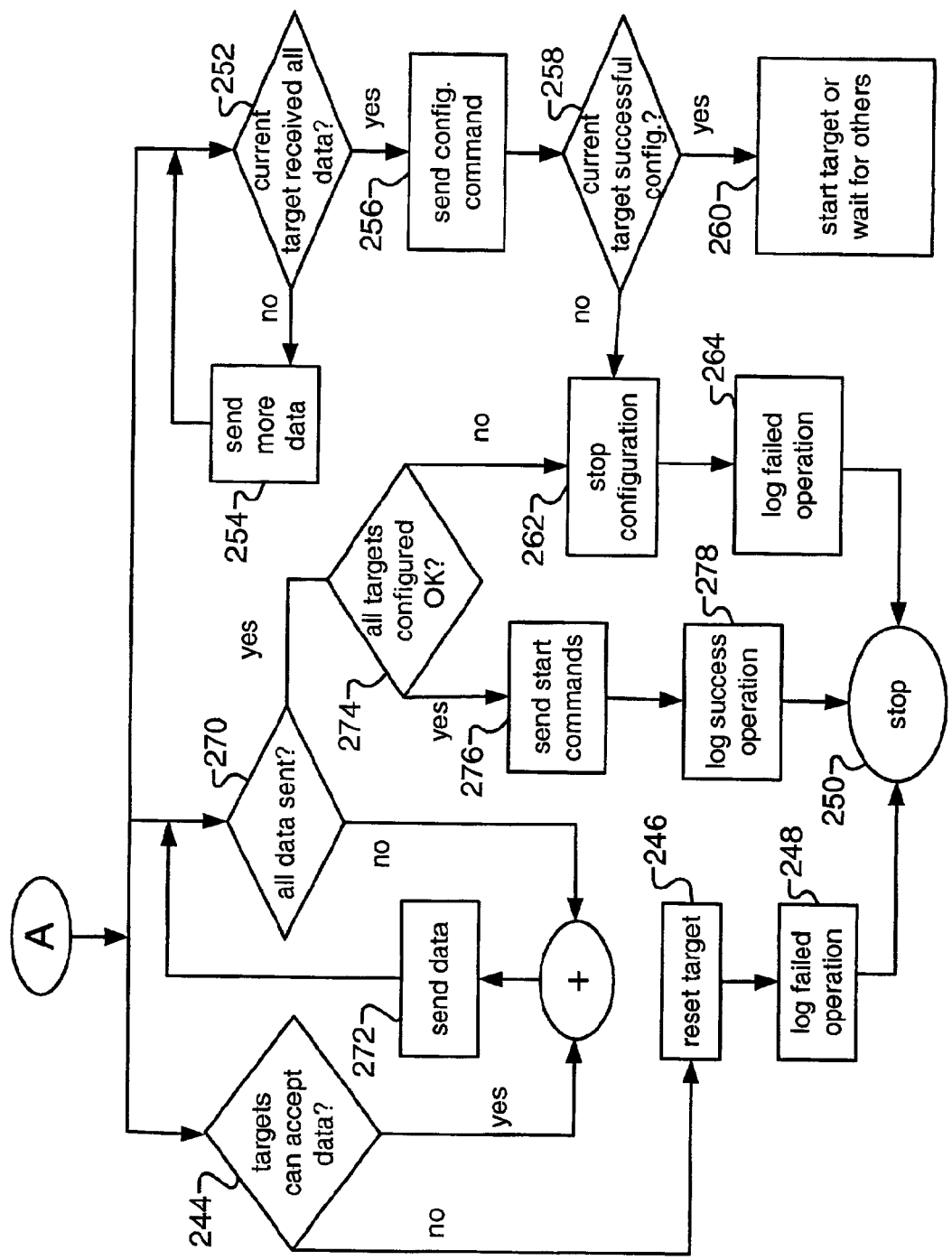

The present invention can be extended to configure multiple programmable logic devices on the same circuit board. FIGS. 5A and 5B, combined, is a flow chart 230 showing the interaction between host 132 and two or more FPGAs. In step 232, host 132 sends query to the FPGAs. In step 234, each FPGA delivers its ID to host 132. In step 236, host 132 compares the received ID with a list previously stored in its memory. If IDs match, flow chart 230 proceeds to the steps shown in FIG. 5B (delivering bitstream and configure the FPGAs). If there is no match, host 132 determines whether it needs to configure another set of FPGAs (step 238). If there is no need to do so, flow chart 230 terminates. If there is a need to do so, flow chart 230 branches back to step 232.

In one embodiment, the ID could be used to uniquely identify a single programmable logic device. In this case, the ID serves to ensure that only the correct device is configured. In another embodiment, the ID could be a generic identification of a type of devices. One example of an ID is the IDCODE used in the so-called Boundary Scan Description Language. This is a unique identification encoded in every FPGA of certain vendors, and is used to identify family members of products. An example of an IDCODE is shown below:

| Bits | Description |
|------|-------------|
| 0 | either 1 or 0 |
| 1–11 | manufacturer ID |
| 12–27 | part number |
| 28–31 | revision |

This type of ID is preferably used in production situation when the same host is used to program a large number of identical circuit boards. The ID can be used to identify the different FPGAs on the circuit boards.

After host 132 determines that the correct FPGAs are present, it performs the following operations at the same time: (1) sending out configuration data to each FPGA and (2) determining whether the target FPGAs are working properly. Turning now to FIG. 5B, host 132 determines whether the FPGAs can continue to accept configuration data (step 244). In one embodiment of the present invention, a FPGA sends a predetermined signal to host 132 if it cannot accept configuration data. If no such signal is received, host 132 assumes that it can continue to send configuration data. If such a signal is received, host sends a reset command to that particular FPGA (step 246). In step 248, host 132 logs this failed operation. The ID of the FPGA is preferably logged so that a user can identify the failed FPGA. Other information may also be logged. Flow chart 230 then terminates (step 250).

Host 132 also monitors the bitstream to determine whether all the data for the current FPGA has been sent (step 252). If not all the data has been sent, host 132 continues to send data (step 254). If all the data has been sent, host 132 transmits a configuration command to the current FPGA (step 256). Host 132 waits for a reply from the FPGA to determine if there is a successful configuration (step 258). If configuration is successful, host 132 determines whether this FPGA should be started at this time or need to wait until another FPGA completes configuration (step 260). If configuration is not successful, host 132 sends a command to the FGPA requesting it to stop configuration (step 262). Host 132 then logs the failed operation (step 264). Flow chart 230 stops.

Host 132 continues to check if all the data for all the FPGAs has been sent (step 270). If some of the data has yet to be sent, and the remaining FPGAs continue to indicate they would accept data, host 132 sends data to the appropriate FPGA (step 272). If all the data has been sent, host 132 determines whether all the FPGAs indicate that configuration has been completed (step 274). If configuration has been completed, host 132 sends start commands to the FPGAs (step 276). In the case where different FPGAs need to start at different times, host 132 sends commands at appropriate times. At step 278, host 132 logs a successful operation. Flow chart 230 then terminates. If one or more FPGAs indicate problems in configuration, host 132 sends a command to stop configuration (step 262). Host 132 then logs the failed operation (step 264).

Figure 6:
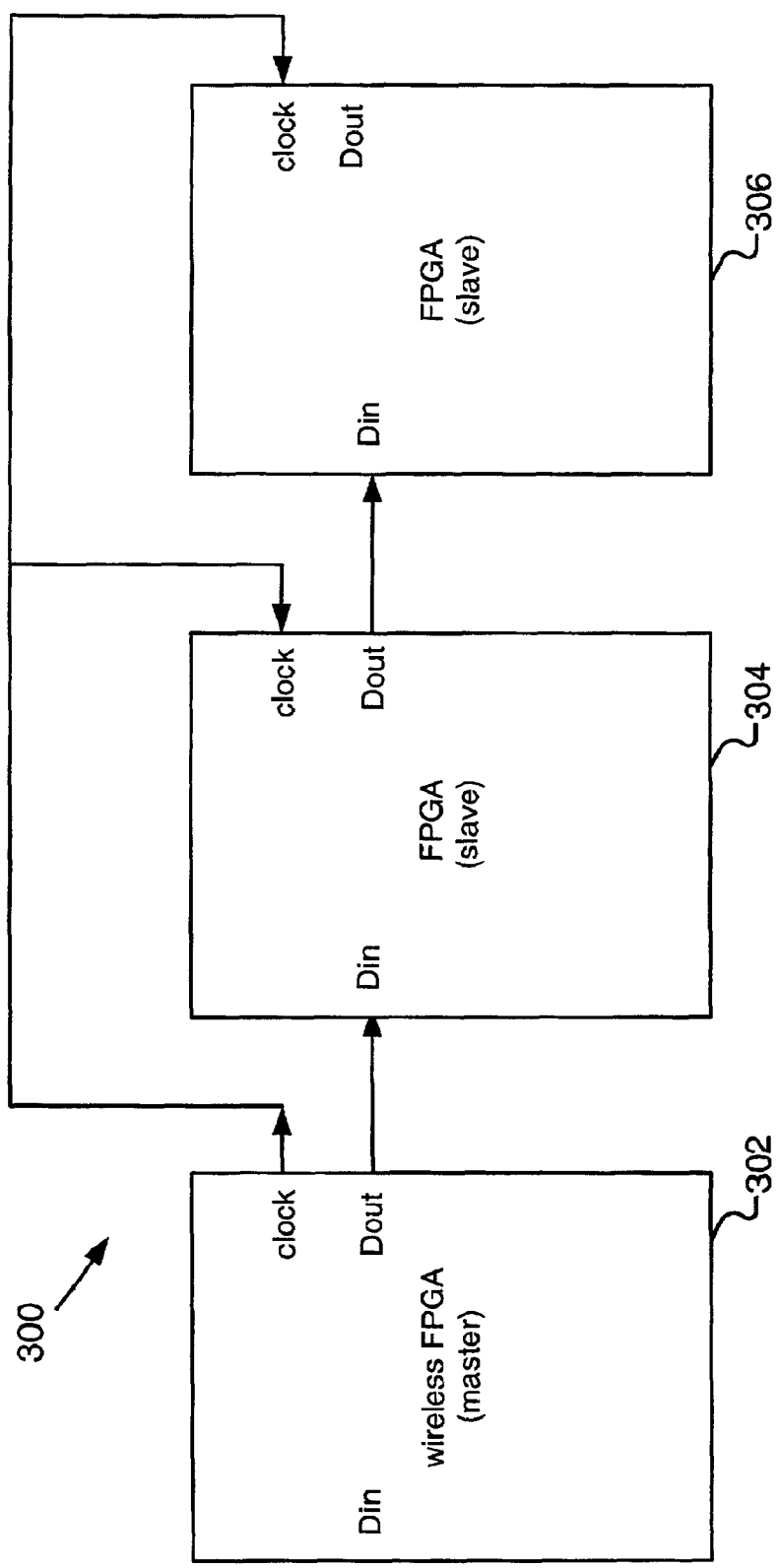
FIG. 6 shows a combination of conventional and wireless FPGAs of the present invention.

The above-described invention may be modified to include a combination of wireless and regular FPGAs on a single circuit board. FIG. 6 shows such a combination 300. It contains a wireless FPGA 302 that functions as a master. A plurality of FPGAs, such as 304 and 306, are connected to wireless FPGA 302. Wireless FPGA 302 receives configuration data in the same way shown in FIG. 4. The configuration data is passed to the slave FPGAs 304 and 306. As a result, a single wireless FPGA can be used to configure a plurality of FPGAs.

In a further embodiment, a target can send a request to a host to load a different set of configuration data into the target. An example is a handheld unit used to handle several jobs. The handheld unit contains a programmable logic device. A user can key in a job number, press a button, and the unit sends the job number to a host. The host then sends new data to reconfigures the programmable logic device inside the unit. In another embodiment, the programmable logic device may erase the information therein if it is not in wireless contact with a host for more than a predetermined time. This embodiment is useful to protect confidential data in the programmable logic device.

It can be seen from the above description that a novel wireless programmable logic device and methods for using the same have been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

What is claimed is:

1. A system comprising:
    a remote host comprising a wireless circuit for communicating digital data; and
    at least two programmable logic devices connected in a circuit, each of said at least two programmable logic devices comprising:
    a wireless transceiver for receiving said digital data from said remote host;
    a base band unit connected to said wireless transceiver to perform data processing operations on said digital data; and
    a programmable logic component connected to said base band unit using said digital data to configure said programmable logic component; and
    wherein each of said at least two programmable logic devices does not have a wired connection to a read-only memory for use in initial configuration.

2. The system of claim 1 wherein said wireless transceiver of at least one of said at least two programmable logic devices is connected to an amplifier.

3. The system of claim 1 wherein said host and said at least two programmable logic devices conform to Bluetooth protocol.

4. The system of claim 1 wherein said at least two programmable logic devices are FPGAs and said digital data is configuration bitstream data.

5. The integrated circuit of claim 1 wherein at least one of said at least two programmable logic devices transmits a reply to said remote host.

6. The system of claim 1 wherein said digital data is generated by an external source, and wherein said wireless circuit further comprises:
    an interface for receiving said digital data from said external source;
    a processor for processing said digital data; and
    a transceiver for transmitting said digital data to said at least two programmable logic devices.

7. The system of claim 6 wherein said wireless transceiver of at least one of said at least two programmable logic devices is connected to an amplifier.

8. The system of claim 6 wherein said at least two programmable logic devices and said host conform to Bluetooth protocol.

9. The system of claim 6 wherein said at least two programmable logic devices are FPGAs and said digital data is configuration bitstream data.

10. The integrated circuit of claim 6 wherein at least one of said at least two programmable logic devices transmits a reply to said remote host.

11. The system of claim 1 wherein said at least two programmable logic devices have different start times, and wherein said host transmits start commands to said at least two programmable logic devices at different times.

12. The system of claim 11 wherein said at least two programmable logic devices and said host conform to Bluetooth protocol.

13. The system of claim 11 wherein said at least two programmable logic devices are FPGAs and said digital data is configuration bitstream data.

14. The integrated circuit of claim 11 wherein at least one of said at least two programmable logic devices transmits a reply to said remote host.

15. The system of claim 1 further comprising at least one slave programmable logic device, wherein at least one of said at least two programmable logic devices is a master device delivering said digital data to said at least one slave programmable logic device.

16. The system of claim 15 wherein said at least two programmable logic devices and said host conform to Bluetooth protocol.

17. The system of claim 15 wherein said at least two programmable logic devices are FPGAs and said digital data is configuration bitstream data.

18. The integrated circuit of claim 15 wherein at least one of said at least two programmable logic devices transmits a reply to said remote host.

\* \* \* \* \*